United States Patent [19]

Sato et al.

[11] Patent Number: 5,296,391
[45] Date of Patent: Mar. 22, 1994

[54] METHOD OF MANUFACTURING A BIPOLAR TRANSISTOR HAVING THIN BASE REGION

[75] Inventors: Fumihiko Sato; Masahiko Nakamae; Mitsuhiro Sugiyama; Tsutomu Tashiro, all of Tokyo, Japan

[73] Assignee: NEC Corporation, Tokyo, Japan

[21] Appl. No.: 67,017

[22] Filed: May 26, 1993

Related U.S. Application Data

[60] Division of Ser. No. 856,815, Mar. 24, 1982, which is a continuation of Ser. No. 684,268, Apr. 12, 1991, abandoned.

[30] Foreign Application Priority Data

| Apr. 13, 1990 | [JP] | Japan | 2-98116 |
| Apr. 19, 1990 | [JP] | Japan | 2-103820 |
| Apr. 25, 1990 | [JP] | Japan | 2-109146 |

[51] Int. Cl.⁵ ............................. H01L 21/265
[52] U.S. Cl. ..................... 437/31; 437/90; 437/99; 437/909; 148/DIG. 10
[58] Field of Search ............. 437/31, 33, 89, 90, 437/99, 909; 148/DIG. 10

[56] References Cited

U.S. PATENT DOCUMENTS

| 4,504,332 | 3/1985 | Shinada | 437/99 |
| 4,753,709 | 6/1988 | Welch et al. | 156/643 |
| 4,824,794 | 4/1989 | Tabata et al. | 437/89 |
| 4,824,799 | 4/1989 | Komatsu | 437/99 |
| 4,958,201 | 9/1990 | Mimura | 357/16 |
| 4,975,381 | 12/1990 | Taka et al. | 437/31 |
| 4,996,581 | 2/1991 | Hamasaki | 357/34 |
| 5,006,912 | 4/1991 | Smith et al. | 357/34 |
| 5,024,957 | 6/1991 | Harame | 437/99 |
| 5,126,285 | 6/1992 | Kosa et al. | 437/31 |
| 5,188,977 | 2/1993 | Stengl et al. | 437/89 |
| 5,204,276 | 4/1993 | Nakajima et al. | 437/31 |
| 5,234,844 | 8/1993 | Okita | 437/31 |

Primary Examiner—Brian E. Hearn
Assistant Examiner—Tuan Nguyen
Attorney, Agent, or Firm—Burns, Doane, Swecker & Mathis

[57] ABSTRACT

A method of manufacturing a semiconductor device includes a monocrystalline semiconductor layer of one conductivity type with a first insulating film covering the semiconductor layer. An aperture is selectively formed in the first insulating film to expose a part of the semiconductor layer. A first polycrystalline semiconductor film of an opposite conductivity type is formed on the first insulating film and has an overhang portion projecting over the aperture from an edge of the first insulating film defining the aperture. A second polycrystalline semiconductor film and a monocrystalline semiconductor film of the opposite conductivity type are grown simultaneously on a bottom surface of the overhang portion of the first polycrystalline semiconductor film and on the part of the monocrystalline semiconductor layer respectively until monocrystalline semiconductor film is in contact with the second polycrystalline semiconductor film, with a second insulating film selectively formed on the monocrystalline semiconductor film with leaving a part thereof to be exposed.

5 Claims, 8 Drawing Sheets

METHOD OF MANUFACTURING A BIPOLAR TRANSISTOR HAVING THIN BASE REGION

This application is a divisional of application Ser. No. 856,815, filed Mar. 24, 1992, pending which is a continuation of application Ser. No. 684,268, filed Apr. 12, 1991, now abandoned.

BACKGROUND OF THE INVENTION

This invention relates to a semiconductor device and, more particularly, to a bipolar transistor having a thin base region and a method of manufacturing the same.

A bipolar transistor is known to operate at a higher speed with decreasing thickness of the base. Besides the thin base, the smaller the transistor size is, the smaller the parasitic capacitance and resistance becomes, resulting in more higher operation speed.

An ion implantation method has been ordinally used to form the thin base. However, the ion implantation method has limitations on injecting impurity ions very shallowly. Moreover, it is unavoidable that the ion implantation method needs an annealing process after ion-implanting to retrieve the littice from defect. The annealing process diffuses the injected impurities to thicken the base region.

Therefore, it has been proposed by K. Suzuki et al in Symp. on VLSI Technol. pp. 91-92 (1989) titled "50 nm Ultra-Thin Base Silicon Bipolar Device Fabrication Based on Photo Epitaxial Growth" to utilize the low-temperature epitaxial growth method to form a thin base layer. While the proposed process provides a thin base layer, an opening for forming an emitter region into the base layer is selectively formed by photolithography process into an insulating layer covering the base layer. It is well known that the photolithography process has mask-misalignment problem unavoidably. The plane size of base layer thereby requires to be large. As a result, parasitic capacitance and resistance become large to ristict the improvement in switching speed.

SUMMARY OF THE INVENTION

It is therefore an object of the present invention to provide a semiconductor device including a bipolar transistor and a method of manufacturing the same, the switching speed of which is improved.

It is another object of the present invention to provide a bipolar transistor and a method of manufacturing the same having a thinner and smaller base region.

According to one aspect of the present invention, there is provide a semiconductor device comprising a aperture selectively formed in a first insulating film covering a monocrystalline semiconductor layer of the one conductivity type, the aperture exposing a part of the layer, a first polycrystalline semiconductor film of the opposite conductivity type selectively formed on the first insulating film and having an overhang portion projecting over a part of the aperture, a second polycrystalline semiconductor film of the opposite conductivity type grown on a bottom surface of the overhang portion to the aperture, a monocrystalline semiconductor film of the opposite conductivity type grown on an entire surface of the part of the monocrystalline semiconductor layer and having a peripheral edge portion that is in contact with the second polycrystalline semiconductor film, and a second insulating film formed to cover surfaces of said first and second polycrystalline semiconductor films and said monocrystalline semiconductor film with leaving a pair of the monocrystalline semiconductor film to be exposed.

According to another aspect of the present invention, a method of manufacturing a semiconductor device is provided which comprises the steps of forming a first insulating film on a monocrystalline semiconductor layer of one conductivity type, forming on the first insulating film a first polycrystalline semiconductor film having selectively a first aperture therein, the first aperture exposing a portion of the first insulating film, covering the first polycrystalline semiconductor film with a second insulating film with leaving a part of the portion of the first insulating film to be exposed, selectively removing the first insulating film by using the second insulating film and the first polycrystalline semiconductor film as a mask to form a second aperture bigger than the first aperture, the second aperture exposing a part of the monocrystalline semiconductor layer and a part of a bottom surface of the first polycrystalline semiconductor film, growing a semiconductor material on the part of the monocrystalline semiconductor layer and on the part of the first polycrystalline semiconductor film to form a monocrystalline semiconductor film of an opposite conductivity type on the part of the monocrystalline semiconductor layer and a second polycrystalline semiconductor film on the part of the first polycrystalline semiconductor film, and covering the second polycrystalline semiconductor film and the monocrystalline semiconductor film with a third insulating film with leaving a part of the monocrystalline semiconductor film to be exposed.

By using the monocrystalline semiconductor film as a base, a sufficiently thin base region is formed to enhance an operation speed. Moreover, an opening or aperture for forming an emitter can be made in a self-alignment manner, so that the transistor size becomes small. Thus, the transistor employing the above structure has excellent high frequency characteristics such as high cut-off frequency $f_T$ (43 GHz, for example), low parasitic capacitance and low parasitic resistance.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Next, embodiments of present invention will be described in detail below with reference to the accompanying drawings.

Figure 1:
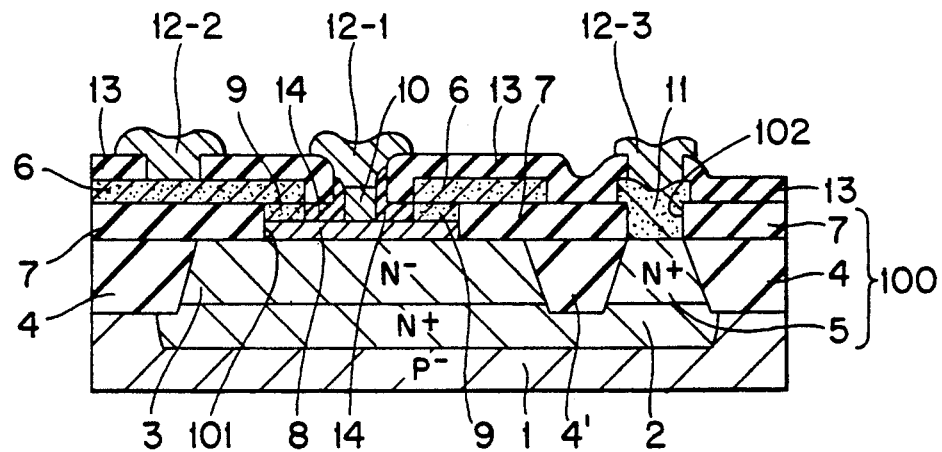
FIG. 1 is a cross-sectional view of a first embodiment of a semiconductor device according to the present invention.

Referring to FIG. 1, a bipolar transistor according to a first embodiment of the present invention is incorporated as one circuit element into a bipolar integrated circuit device or Bi-CMOS integrated circuit device. More specifically, N+-type collector buried region 2 is selectively formed in a P-type monocrystalline silicon substrate 1 having resistivity of 10 to 15 Ω.cm. A N-type monocrystalline epitaxial layer 3 of about $5 \times 10^{15}$ cm$^{-3}$ impurity concentration is formed on the silicon substrate 1 with 1.0 μm in thickness. The epitaxial layer 3 is divided into a plurality of island regions by insulating films 4 reaching the substrate 1 formed by the well-known selective oxidation. In FIG. 1, only one island region 3 on the buried region 2 is illustrated. This island region 3 is further divided into two parts by the oxide film 4' reaching the buried region 2. The left part serves as a collector region and the right part serves as a collector lead-out region 5 whose impurity concentration is increased by further impurity diffusion. Thus, a basic body 100 is provided. This basic body 100 is covered with a silicon nitride film 7. If desired, a silicon oxide film can be inserted between the silicon nitride film 7 and the body 100. Two apertures 101 and 102 are selectively formed in the film 7 to expose parts of the collector regions 3 and 5, respectively. Formed on the silicon nitride film 7 is a P-type polycrystalline silicon film 9. As shown in FIG. 1, this silicon film 9 has a overhand portion projecting over the aperture 101 from the peripheral edge of the film 7 defining the aperture 101. A P-type polycrystalline silicon film 6 grown on the bottom surface of the overhang portion of the film 6 to the collector region 3. On the other hand, a P-type monocrystalline base region 8 is formed on the exposed collector region 3 by epitaxial growth. The peripheral edge portion of the base region 8 is in contact with the polycrystalline silicon film 9. The films 6 and 9 thus serve as a base lead-out region. Formed in the aperture 101 is an N-type polycrystalline silicon layer 11 in contact with the collector lead-out region 5. The base region 8 and the polycrystalline silicon layers 6 and 9 are covered with a silicon dioxide films 13 and 14 except the emitter region 10 and a part of the film 11. The N-type emitter region 10 is formed of monocrystalline silicon in this embodiment. An emitter electrode 12-1, a base electrode 12-2 and a collector electrode 12-3 all made of metal such as aluminium are formed in contact with the emitter region 10 and the polycrystalline silicon layers 6 and 11, respectively.

The base region 8 can be formed thin by the epitaxial growth under control of the thickness of the silicon nitride film 7. Moreover, the emitter region 10 is formed in the self-aligned manner to make the size of the base region 8 small. As a result, a high-speed bipolar transistor is provided.

Next, description will be made on the manufacturing steps of the transistor shown in FIG. 1 with reference to FIGS. 2A to 2J.

Figure 2A:
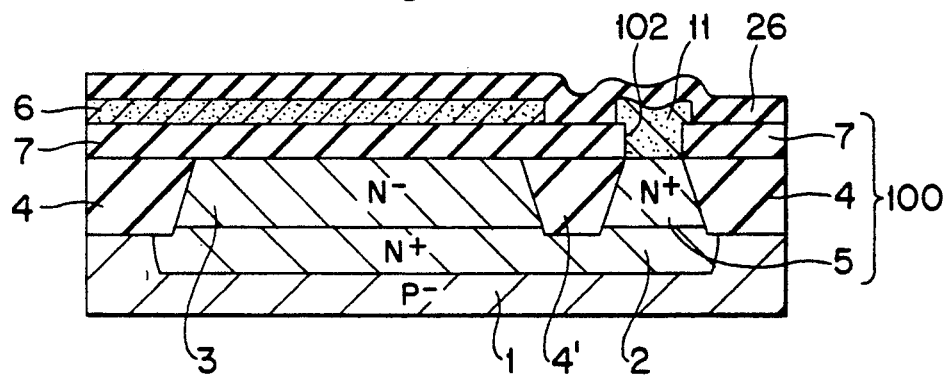
FIGS. 2A through 2J are cross-sectional views for illustrating in sequence the manufacturing steps of the transistor shown in FIG. 1.

Referring to FIG. 2A, the buried region 2 is selectively formed in the substrate 1, followed by the growth of the epitaxial layer 3. The selective oxidation is thereafter carried out to form the oxidation films 4 and 4'. N-type impurities are selectively diffused to form the lead-out region 5. The silicon nitride film 7 is then formed over the entire surface, followed by making a hole to expose a part of the region 5. The polycrystalline silicon layer 11 of the N-type is selectively formed to be in contact with the region 5 through the hole. Thereafter, the polycrystalline silicon layer 6 of the P-type is selectively formed on the film 7, followed by forming a silicon oxide film 26 over the entire surface.

Figure 2B:
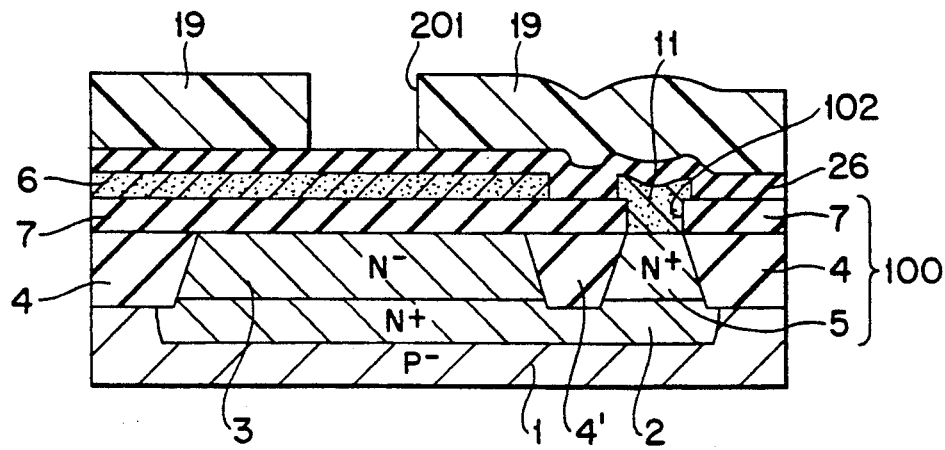

Next, a photoresist film 19 is formed to cover the upper surface of the silicon dioxide film 26, followed by selective etching to form a hole 201 corresponding to a base and emitter forming portion, as shown in FIG. 2B.

Figure 2C:
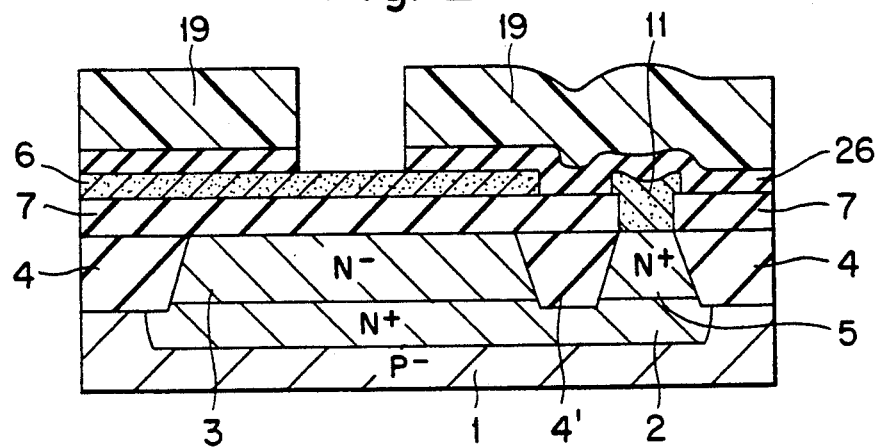
Figure 2D:
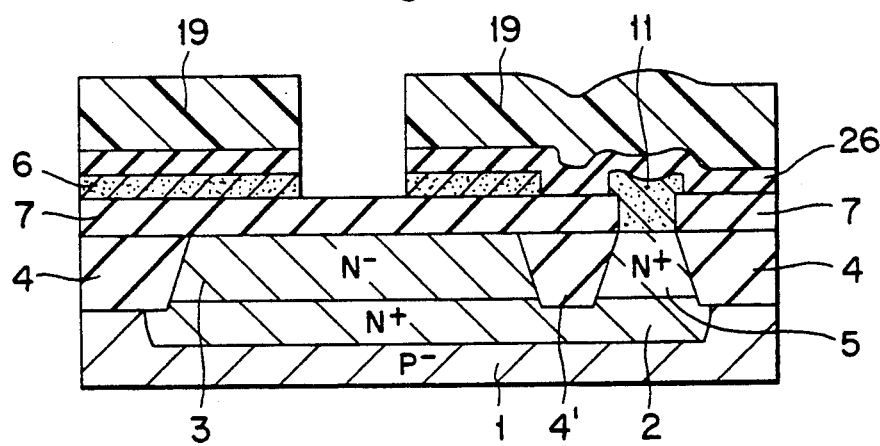

In the next step, the corresponding portion of the silicon dioxide film 26 is removed by anisotropic dry etching, as shown in FIG. 2C. The polycrystalline film 6 is then removed selectively by the anisotropic dry etching as the film 26 being a mask, as shown in FIG. 2D. The photoresist 19 is thereafter removed.

Figure 2E:
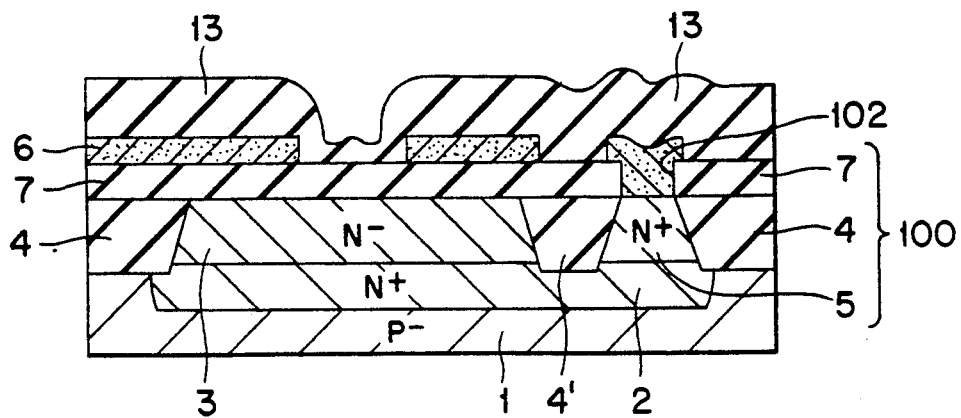

In the following step, as in shown in FIG. 2E, a silicon dioxide (SiO$_2$) film is deposited over the whole surface by LPCVD technique. In order to avoid the complication of the drawing, the new deposited silicon oxide film and the preceding oxide film 26 are depicted as only one silicon oxide film 13.

Figure 2F:
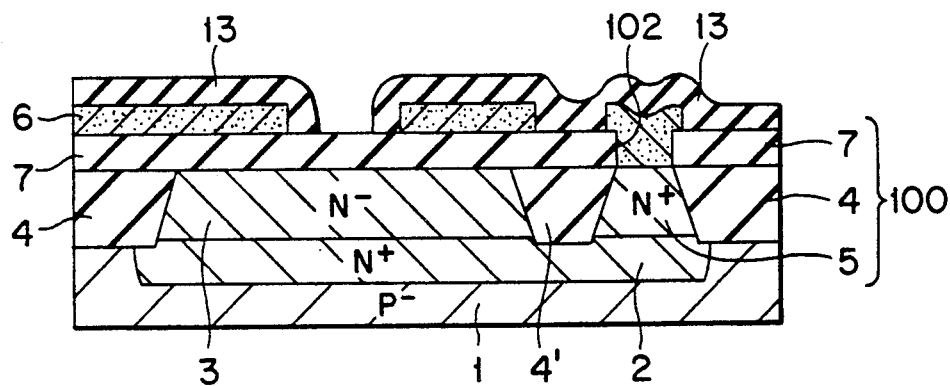

In the next step, the anisotropic dry etching is carried out until the portion of the film 13 above the film 7 is removed away. The oxide film 13 thus remains over the upper and both side surfaces of the film 6 and a part of the film 7 was exposed, as shown in FIG. 2F.

Figure 2G:
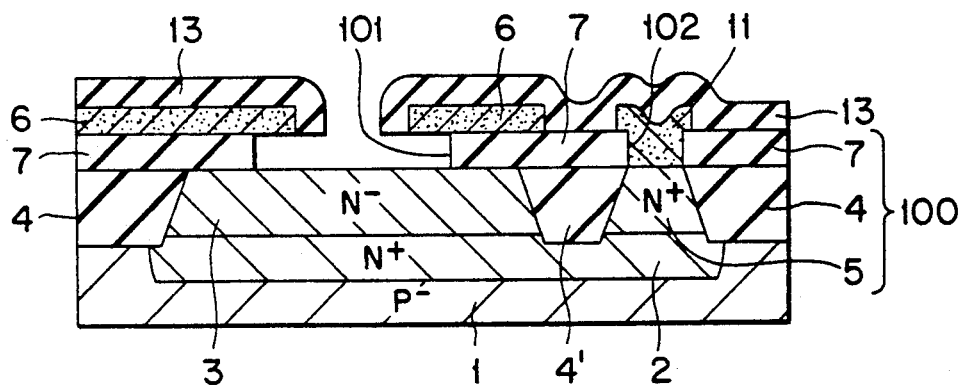

In the next step, the silicon nitride film 7 is etched out by the wet etching using heated phosphoric acid to enlarge the hole bilaterally by a specified size so that the upper surface of the n-type silicon epitaxial layer 3 become exposed in the area where a base is to be formed and the base-electrode film 6 is overhand above the area where the base is to be formed, as shown in FIG. 2G. The overhang length, that is, the length of the under surface exposed, is about 2000 Å.

Figure 2H:
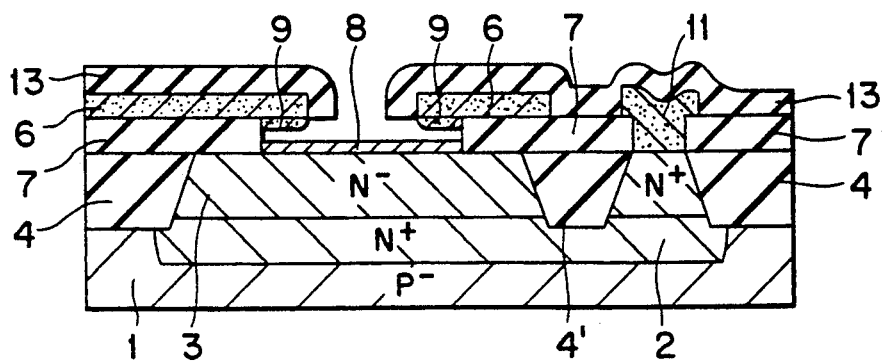
Figure 2I:
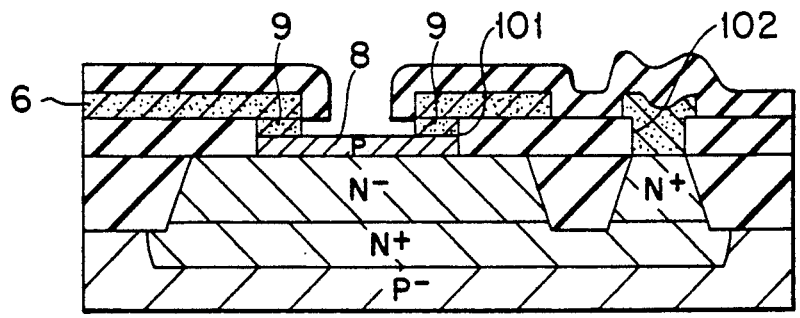

In the next step, MBE growth of silicon is carried out to form a monocrystalline silicon film 8 containing p-type impurity on the surface of the exposed epitaxial silicon layer 3 and a polycrystal as well as a polycrystalline silicon film 9 containing p-type impurity on the exposed under surface of the film 6 simultaneously, as shown in FIG. 2H. Before this step, it is necessary to remove thin natural dioxide films on the exposed surface of the collector region 3 and the silicon film 6. For this purpose, the wafer is dipped in HF etching solution (for example, 130 BHF) for 30 seconds. Thereafter, the wafer is put into MBE (Molecular Beam Epitaxy) reaction chamber and heated at 850° C. for 10 minutes. As a result, the thin natural dioxide films are perfectly removed. Subsequently, the MBE growth is carried out under the condition of 560° C. in substrate temperature, using Si$_2$H$_6$ (flow rate 70 sccm) as a material gas, about $2 \times 10^{-5}$ torr in pressure, and using B$_2$H$_6$ as a doping gas. The film growing speed is about 70 Å/min. The growth of silicon is continued until the end portion of the upper surface of the p-type impurity polycrystalline silicon layer 9 is in contact with the peripheral edge portion of the monocrystalline silicon base region 8, as shown in FIG. 2I. The thickness of the silicon films 8 and 9 are about 600 Å and about 500 Å, respectively.

The base film 8 can further become thin by controlling the thickness of the film 7.

If desired, the films 8 and 9 are formed by other processes such as UHF/CVD (Ultra-High Vacuum/-Chemical Vapour Deposition).

Figure 2J:
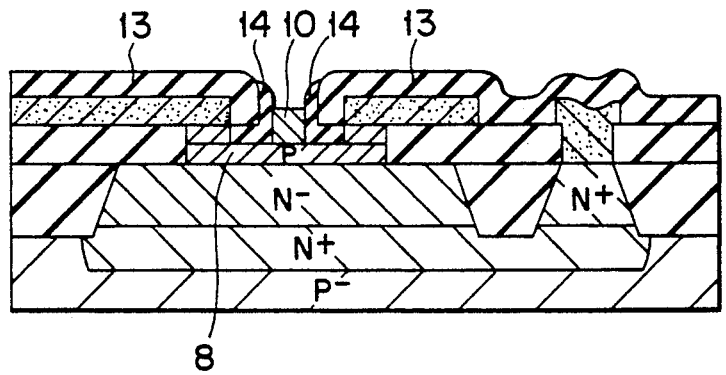

In the next step, a silicon dioxide film is deposited over the whole surface by LPCVD technique, then etched back by the dry etching to form a the silicon dioxide film 14 as shown in FIG. 2J. Subsequently, a monocrystalline silicon film 10 has an emitter is grown on the exposed surface portion of the base 8 with n-type impurity concentration of $1 \times 10^{19}$. That is, the emitter 10 is formed in a self-alignment manner.

In subsequent step, contact holes for base and collector metal electrode are selectively opened in the silicon dioxide film 13. Aluminium are deposited and then selectively removed to form emitter, base and collector electrodes 12-1, 12-2 and 12-3. Thus, the semiconductor device shown in FIG. 1 has been obtained.

A pnp-type transistor can be fabricated similarly only by using alternative impurities.

Figure 3:
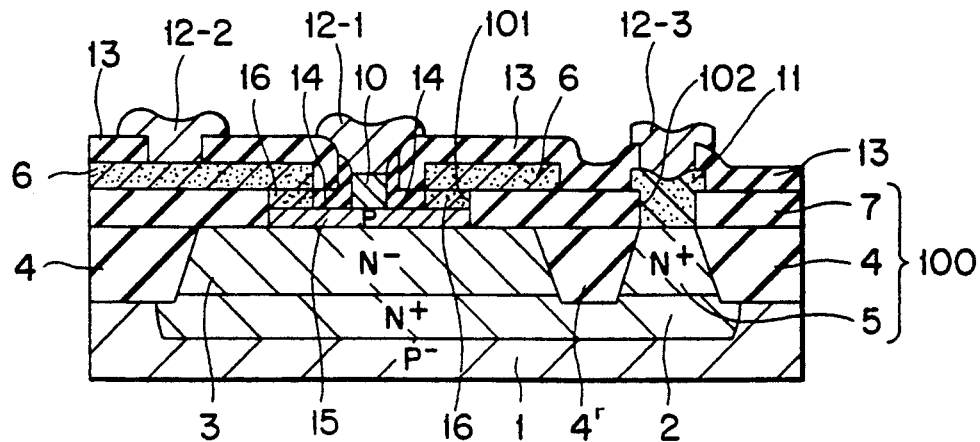
FIG. 3 is a cross-sectional view of a second embodiment of the present invention.

Referring to FIG. 3, there is shown a second embodiment in which the same constituents as those shown in FIG. 1 are denoted by the same reference numerals to omit further description thereof. In this embodiment, silicon-germanium mixed crystal layers 15 and 16 are used in place of silicon layers 8 and 9 in FIG. 1. These films 15 and 16 are formed by MBE under the almost same condision as the first embodiment except addition of another $GeH_4$ gas. The flow rate ratio between $Si_2H_6$ and $GeH_4$ is 10:1. The monocrystalline silicon-germanium mixed crystal base film 15 contain germanium in 10 mole %. The base film 15 has a forbidden band width narrower than that of the silicon emitter 10. This reduction in width depends on content of Ge (mol %) and the distortion of the silicon-germanium alloy film. This difference in forbidden band width works as a barrier to minot carriers injected from the base into the emitter, and consequently increase in base current is suppressed, contributing to improvement of cut-off frequency $f_T$. The difference in forbidden band width makes current amplification factor $h_{FE}$ sufficiently great to hold the collector-emitter breakdown voltage $BV_{CEO}$ a certain value or higher even if base layer is of thinner thickness and higher concentration.

Figure 4:
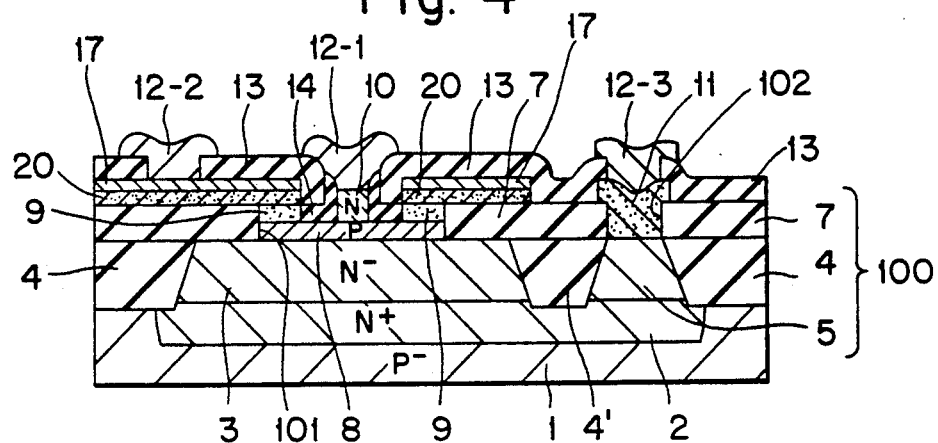
FIG. 4 is a cross-sectional view of a third embodiment of the present invention.

A third embodiment of the present invention will be described referring to FIG. 4 illustrating it in cross section. It is the same in structure and fabricating process as the first embodiment except that instead of the portion of the polysilicon film 6 in the first embodiment, a double layer structure composes of a $TiSi_2$ film 17 and polysilicon film 20 is used. Thereby the base resistance can be lower in virtue of lower resistance of $TiSi_2$ film 17. The double-layer structure can be formed by sputtering of a Ti film on polysilicon film 20 and then heat treatment. For example, the sheet resistance $\rho s$ becomes 4.5 to 6.8 $\Omega$ when $TiSi_2$ film 17 and polysilicon film 20 have about 440 Å and 660 Å in thickness, respectively, and a specified wiring width, and is not more than a half that ($\rho s$ 18 to 20.5) of polysilicon film 6 when it has an about 1100 Å in thickness and the same wiring width.

Figure 5:
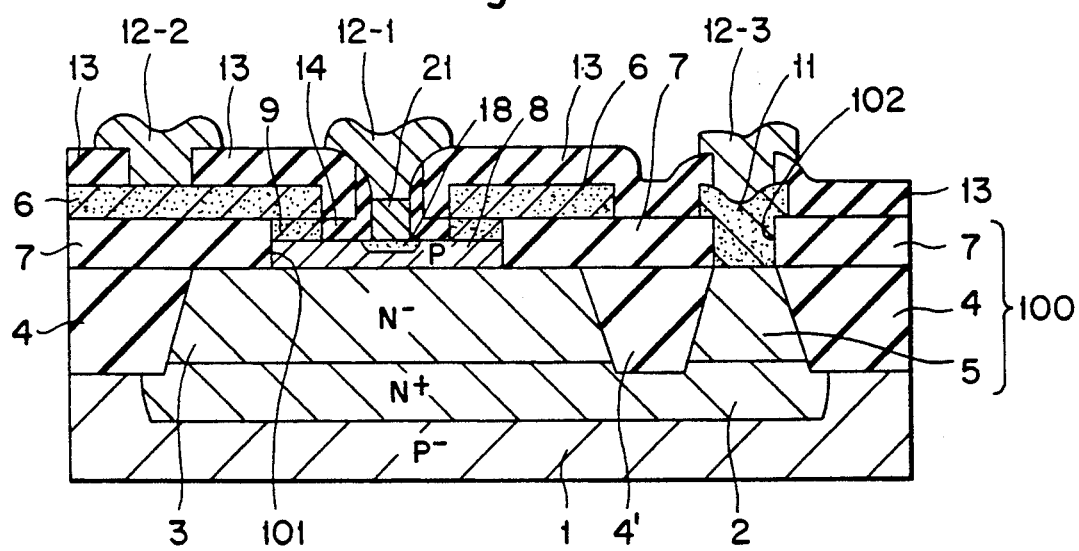
FIG. 5 is a cross-sectional view of a fourth embodiment of the present invention.

FIG. 5 illustrates in cross section a fourth embodiment of semiconductor device of the present invention. The structure and fabrication process of it are substantially the same as the first embodiment, and only different respects will be described. This embodiment is characterized by n-type impurity-added polysilicon film 21 working as emitter and by a $n^+$-type emitter diffusion layer 18. The latter has by itself an effect of making intrinsic base film 8 thinner, contributing to higher transistor switching speed. Besides the formation of this diffusion layer 18, the impurities in base 8 are also diffused from there into epitaxial layer 3, and consequently may cause the base-collector junction to somewhat shift towards the collector.

Figure 6A:
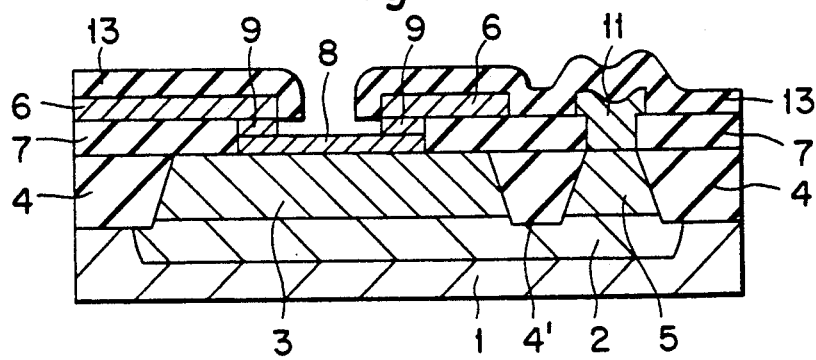
FIGS. 6A and 6B are cross-sectional view for illustrating essential processing steps of the semiconductor shown in FIG. 5.
Figure 6B:
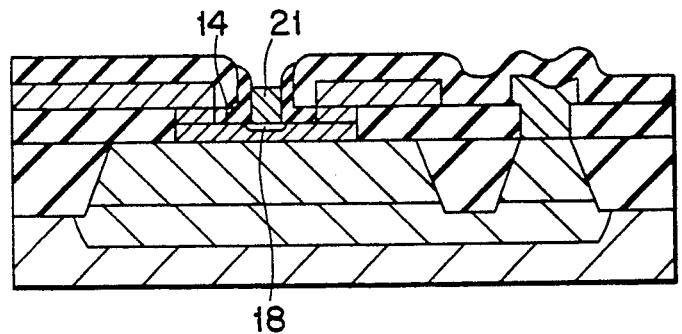

FIGS. 6A and 6B illustrate in cross section the processing steps of fabricating the semiconductor device of this embodiment, the process reaching the state shown in FIG. 6a which corresponding to FIG. 2I is the same as the first embodiment.

in the next step, as viewed in cross section in FIG. 6B, a silicon dioxide film 14 is deposited by LPCVD techtnique, and etched back by dry etching, leaving silicon dioxide film 14 on the side wall of the outer base 6. Then a n-type polysilicon film 21 as emitter electrode is formed on the intrinsic base film 8 except where covered with insulating silicon film 14. Subsequently $N^+$-type emitter diffusion layer 18 is formed in intrinsic base film 8 by thermal treatment.

Further the process is proceeded in the same way as in Embodiment 1: In sequence holes for the base and collector of metal electrodes are opened in the silicon dioxide film 13, Al film is deposited by evaporation over the whole surface, and processed by photolithography to leave only the areas of the emitter, base and collector electrodes 12. Thus the semiconductor device shown in cross section in FIG. 6B is obtained.

Figure 7:
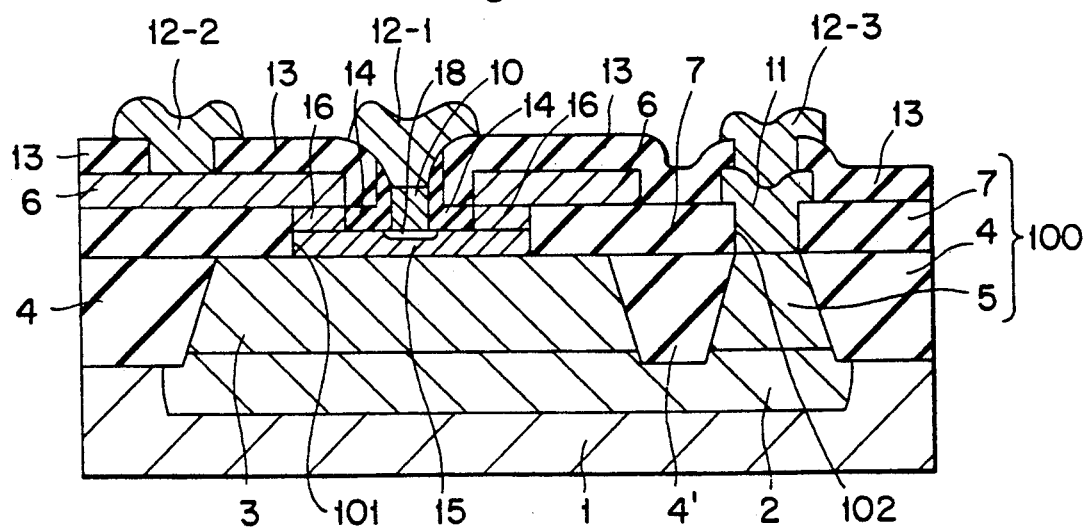
FIG. 7 is a cross-sectional view of a fifth embodiment of the present invention.

A fifth embodiment of the present invention will be described with reference to FIG. 7. The structure and fabricating process of it incorporate the respective features of the second embodiment and the fourth embodiment. In other words, this embodiment is a modified the fourth embodiment to which single crystal silicon-germanium alloy film 15 and outer polysilicon germinium base 16 in the second embodiment are applied, thereby the semiconductor device having combined characteristics of the second and fourth embodiments, and hence higher switching speed can be offered.

Besides in this embodiment, as in the third embodiment, in order to reduce the base resistance, the base-electrode polysilicon film may have a double-layer structure consisting of a $TiSi_2$ film and polysilicon layer 10.

Figure 8:
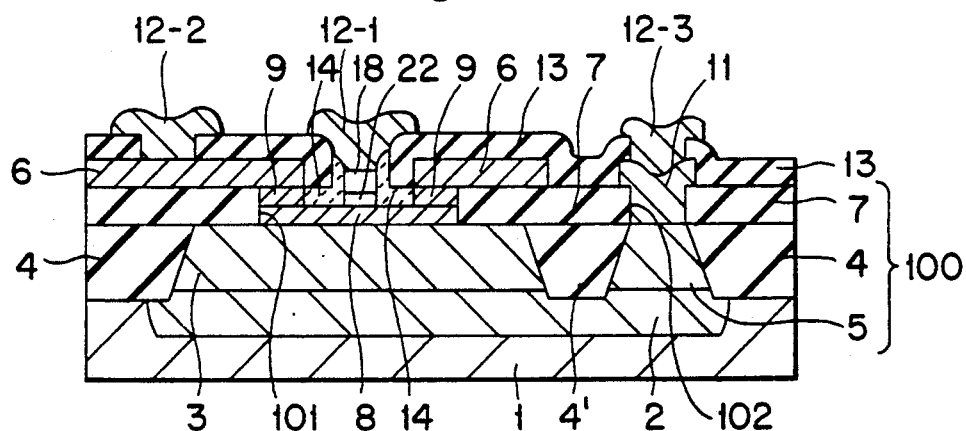
FIG. 8 is a cross-sectional view of a sixth embodiment of the present invention.

FIG. 8 illustrates in cross section a sixth embodiment of semiconductor device of the present invention of which the structure is mostly the same as that of the first embodiment, and the distinctive respects are an n-type impurity-added ($1 \times 10^{19}$ atm/cm$^3$) single crystal silicon film 22 and a polysilicon film 18 each as emitter electrode. Emitter-electrode polysilicon film 18 contributes to reduction of the base current of the transistor, and as the result to improvement in current amplification factor. Besides it is also effective as a barrier to the alloy spike between metal and base due to heat treatment after connecting metal.

Figure 9A:
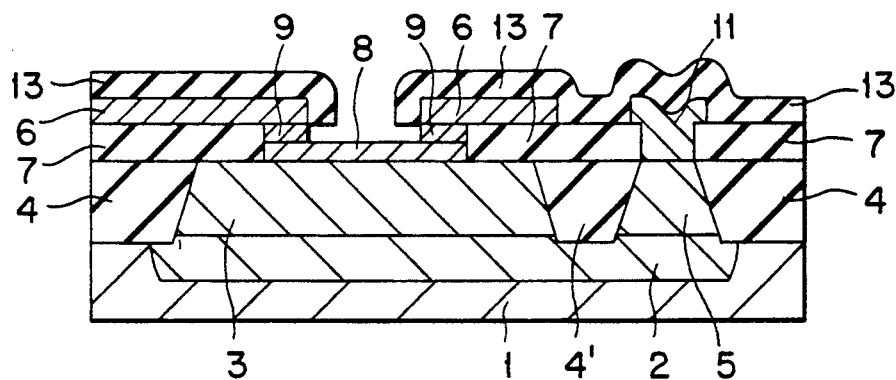
FIGS. 9A and 9B are cross-sectional views for illustrating essential processing steps of the semiconductor shown in FIG. 8.
Figure 9B:
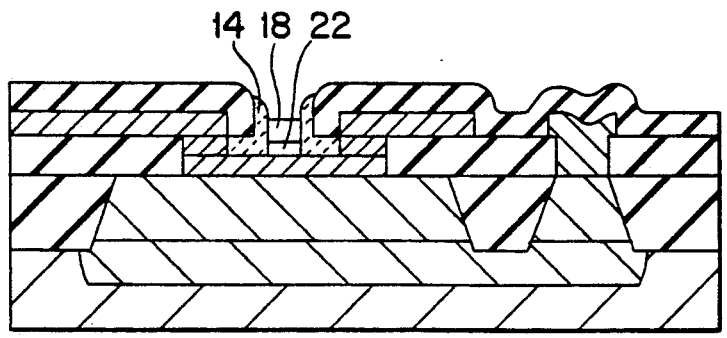

FIGS. 9A and 9B illustrates in cross section the processing steps for fabricating a semiconductor device of the sixth embodiment 6 of the present invention. The state of FIG. 9A which corresponds to FIG. 2I was attained in the same way as the first embodiment.

Referring to FIG. 9B, the formation step of silicon dioxide film 14 and the previous steps are the same as those in the first embodiment, and hence the subsequent processing steps will be described: single crystal silicon emitter 22 resulted from doping of n-type impurity to $1 \times 10^{19}$ cm$^{-3}$ and growth of to a thickness of 500 Å.

Then a polysilicon film 18 is deposited as emitter electrode.

Figure 10:
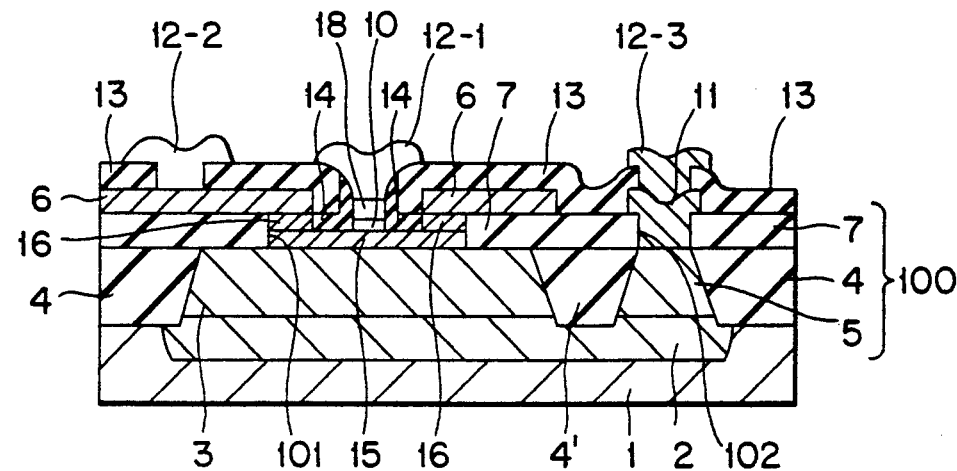
FIG. 10 is a cross-sectional view of a seventh embodiment of the present invention.

Referring to FIG. 10 illustrating in cross section a swventh embodiment of the present invention which will be described, the structure and fabricating process are modification of those of the sixth embodiment by the application of the features of the second embodiment: a single crystal silicon-germanium alloy film 15 and an outer base film 16 to the sixth embodiment. In other words, this embodiment can be provided by the use of alloy film 15 and outer base film 16 in the second embodiment instead of intrinsic base 8 and outer base 9 in the sixth embodiment. Thereby the respective improving means of both embodiments for increasing transistor switching speed are incorporated, enabling realization of more higher speed transistors.

Figure 11:
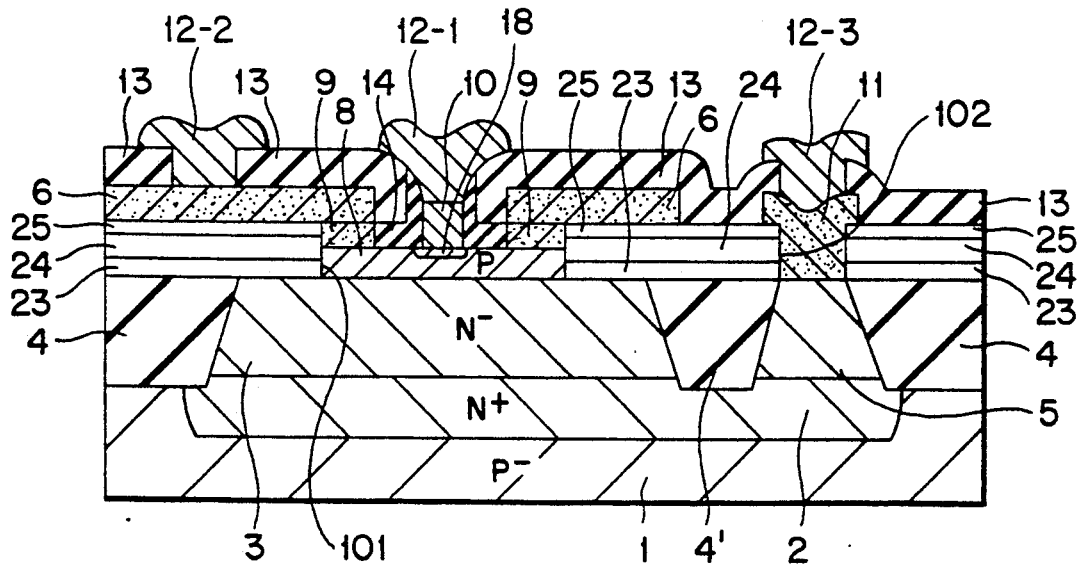
FIG. 11 is a cross-sectional view of an eighth embodiment of the present invention.

FIG. 11 illustrates in cross section an eighth embodiment of this invention which is the same as the first embodiment except that is distinguished in the respect of having a triple-layer structure consisting of $SiO_2$ film 23, a silicon nitride film 24 and $SiO_2$ film 25 instead of silicon nitride film 7 in the first embodiment. This triple-layer structure functions as insulating film, and, because of its low dielectric constant compared with silicon nitride film, has effect of lowering capacitance coupling between the upper and lower layers.

In this fabrication process, instead of forming silicon nitride film 7, three steps sequentially are performed to form a $SiO_2$ film 23 to a thickness of 450 Å by the CVD technique, a silicon nitride film 24 to a thickness of 450 Å by a the CVD technique, and a $SiO_2$ film 25 to a thickness of 200 Å by the CVD technique. Further modification is that instead of the step of etching silicon nitride film 7 on epitaxial layer 3 with phosphoric acid in the first embodiment, with phosphoric acid as from FIG. 2F to FIG. 2G, firstly silicon dioxide film 14 is etched to form a hole for the emitter extending through $SiO_2$ film 25, and thus to expose silicon nitride film 24 in this area. Then silicon nitride film 24 is etched laterally in the cross-sectional view, thus a cave extending to substantially the same depth as that in the first embodiment. Then $SiO_2$ films 23 and 25 are removed with fluoric acid so that an inverted T-shaped hole is made on epitaxial layer 3 of the same figure as the corresponding hole in FIG. 2G. All the processing steps in this embodiment except these steps are the same as in the first embodiment. The advantage of the fabricating process resides in that since Si outer base 9 is not undergo direct etching with phosphoric acid, it is possible to prevent phosphoric atoms from being adsorbed on the surface of Si outer base 9, thereby increase of resistance of the base that would be caused if not so is avoidable. This triple-layer structure can be applied to other embodiments.

It is apparent that the present invention is not limited to the above embodiments, but may be modified and changed without departing from the scope and spirit of the invention.

What is claim is:

1. A method of manufacturing a semiconductor device comprising the steps of:
    forming a first insulating film on a monocrystalline semiconductor layer of one conductivity type;
    covering said first insulating film with a first polycrystalline semiconductor film of an opposite conductivity type having a first aperture exposing a portion of said first insulating film;
    covering said first polycrystalline semiconductor film with a second insulating film with leaving a part of said portion of said first insulating film to be exposed;
    selectively removing said first insulating film by using said second insulating film and said first polycrystalline semiconductor film as a mask to form a second aperture bigger than said first aperture, said second aperture exposing a part of said monocrystalline semiconductor layer and a part of a bottom surface of said first polycrystalline semiconductor layer; and
    growing a semiconductor material to form a monocrystalline semiconductor film of said opposite conductivity type on said part of monocrystalline semiconductor layer and a second polycrystalline semiconductor film of said opposite conductivity type on said part of said first polycrystalline semiconductor film until said monocrystalline semiconductor film is in contact with said second polycrystalline film.

2. The method as claimed in claim 1, wherein said monocrystalline semiconductor film and said first and second polycrystalline semiconductor films are made of silicon.

3. The method as claimed in claim 1, wherein said first insulating film includes a silicon nitride film and said second insulating film includes a silicon oxide film.

4. The method as claimed in claim 1, wherein said second semiconductor material is silicon-germanium mixed crystal so that said monocrystalline semiconductor film and said second polycrystalline silicon film are made of silicon-germanium mixed crystal.

5. The method as claimed in claim 1, further comprising the step of:
    forming a refractory silicide film on said first polycrystalline semiconductor before covering said polycrystalline semiconductor film with said second insulating film.

* * * * *